United States Patent
Hanamura

(10) Patent No.: US 7,374,799 B2
(45) Date of Patent: May 20, 2008

(54) RADIATION SENSITIVE COMPOSITION, MICROLENS, PROCESS FOR FORMING MICROLENS AND USE OF THE MICROLENS

(75) Inventor: Masaaki Hanamura, Chuo-ku (JP)

(73) Assignee: JSR Corporation, Tokyo (JP)

( * ) Notice: Subject to any disclaimer, the term of this patent is extended or adjusted under 35 U.S.C. 154(b) by 292 days.

(21) Appl. No.: 11/011,091

(22) Filed: Dec. 15, 2004

(65) Prior Publication Data

US 2005/0157399 A1 Jul. 21, 2005

(30) Foreign Application Priority Data

Dec. 25, 2003 (JP) ............... 2003-429061

(51) Int. Cl.
*G03C 1/725* (2006.01)

(52) U.S. Cl. ............... 428/1.3; 428/1.1; 430/281.1; 349/95

(58) Field of Classification Search .......... 428/1.1, 428/1.3; 430/281.1, 288.1, 321, 324–325, 430/330, 434, 910; 349/95
See application file for complete search history.

(56) References Cited

U.S. PATENT DOCUMENTS

| | | | |
|---|---|---|---|
| 5,965,328 A * | 10/1999 | Sano et al. ........ | 430/315 |
| 6,010,824 A | 1/2000 | Komano et al. | |
| 6,294,313 B1 * | 9/2001 | Kobayashi et al. ...... | 430/302 |
| 6,908,655 B2 * | 6/2005 | Arakawa et al. ........ | 428/64.1 |
| 6,946,498 B2 * | 9/2005 | Kayanoki ............... | 522/99 |
| 2002/0006558 A1 * | 1/2002 | Kobayashi et al. ........ | 430/7 |
| 2002/0020832 A1 | 2/2002 | Oka et al. | |
| 2003/0004221 A1 * | 1/2003 | Sakurai et al. ........... | 522/15 |
| 2003/0214718 A1 | 11/2003 | Kaminsky et al. | |
| 2004/0094752 A1 * | 5/2004 | Ito et al. ................. | 252/578 |

FOREIGN PATENT DOCUMENTS

| | | |
|---|---|---|
| EP | 0 832 917 A1 | 4/1998 |
| JP | 10-268305 | 10/1998 |
| JP | 11-109417 | 4/1999 |
| JP | 2001-117114 | 4/2001 |
| JP | 2001-154181 | 6/2001 |
| JP | EP 01 548 497 A1 * | 6/2005 |

* cited by examiner

*Primary Examiner*—Callie Shosho
*Assistant Examiner*—Sow-Fun Hon
(74) *Attorney, Agent, or Firm*—Oblon, Spivak, McClelland, Maier & Neustadt, P.C.

(57) ABSTRACT

A radiation sensitive composition containing inorganic oxide particles; a copolymer of at least one unsaturated compound selected from the group consisting of an unsaturated carboxylic acid and an unsaturated carboxylic anhydride and other unsaturated compound different from the unsaturated compound; a polyfunctional unsaturated compound having at least two ethylenically unsaturated groups in the molecule; and a radiation sensitive polymerization initiator. The composition is useful for making a microlens.

12 Claims, No Drawings

RADIATION SENSITIVE COMPOSITION, MICROLENS, PROCESS FOR FORMING MICROLENS AND USE OF THE MICROLENS

FIELD OF THE INVENTION

The present invention relates to a radiation sensitive composition suitable for the formation of a microlens by photolithography, a microlens made of the radiation sensitive composition, a process for forming the microlens, and a liquid crystal display device comprising the microlens.

DESCRIPTION OF THE PRIOR ART

A liquid crystal display device is most widely used in flat panel displays due to its excellent characteristic properties such as low power consumption, high reliability, size flexibility, high-definition display properties, compactness and lightweight. However, the requirement for the performance of the liquid crystal display device is becoming more and more severe due to the spread of OA equipment such as personal computers and word processors, liquid crystal TV's, portable telephones and projectors.

To meet the above requirement, JP-A 2001-154181, JP-A 2001-117114, JP-A 11-109417 and JP-A 10-268305 (the term "JP-A" as used herein means an "unexamined published Japanese patent application") disclose that the brightness and contrast of a liquid crystal display device are improved by converging extraneous light or back light on an opening by installing a microlens array. However, in these methods, as the focusing distance from the converging layer where a microlens is existent to the openings of pixels is very short in most cases, the difference in refractive index between the material of the microlens and a flattening film must be made large and the curvature radius of the microlens must be controlled precisely.

To form the microlens for liquid crystal display devices, there are proposed the following methods: one in which a depression is formed in a glass substrate by etching and filled with an ultraviolet light curable resin having a high refractive index, one in which a lens pattern is formed and a radiation sensitive composition is used as it is by melt flowing the pattern by heating, and one in which a lens form is transferred to a base material by dry etching with a radiation sensitive composition which is molten to flow as a mask.

However, in these methods, the process for forming a microlens is complicated and costs dear. Therefore, the development of a radiation sensitive composition which can provide a microlens having excellent characteristic properties such as high refractive index more easily and the development of an improved process for forming the above microlens have been desired.

SUMMARY OF THE INVENTION

It is therefore an object of the present invention to provide a radiation sensitive composition capable of forming a high-definition microlens and microlens array having high storage stability and resolution and excellent balance among characteristic properties.

It is another object of the present invention to provide a microlens having a high refractive index and excellent balance among characteristic properties such as transparency, heat resistance, thermal discoloration resistance and solvent resistance, an improved process for forming the microlens, and a liquid crystal display device comprising the microlens.

Other objects and advantages of the present invention become apparent from the following description.

According to the present invention, firstly, the above objects and advantages of the present invention are attained by a radiation sensitive composition comprising:
(A) inorganic oxide particles;
(B) a copolymer of at least one unsaturated compound selected from the group consisting of an unsaturated carboxylic acid and an unsaturated carboxylic anhydride and other unsaturated compound different from the above unsaturated compound;
(C) a polyfunctional unsaturated compound having at least two ethylenically unsaturated groups in the molecule; and
(D) a radiation sensitive polymerization initiator.

According to the present invention, secondly, the above objects and advantages of the present invention are attained by a process for forming a microlens, comprising the steps of:
(1) applying the above radiation sensitive composition to a substrate to form a coating film;
(2) applying radiation to at least part of the coating film to cure an exposed part;
(3) developing the coating film after exposure to remove an unexposed part; and
(4) heating the coating film after development.

According to the present invention, the above objects and advantages of the present invention are attained by a microlens made of the radiation sensitive composition of the present invention and a liquid crystal display device, facsimile, electronic copier, solid image pick-up device or optical fiber connector comprising the microlens.

The term "radiation" as used herein means ultraviolet radiation, far ultraviolet radiation, X-rays, electron beam, molecular beam, γ-rays, synchrotron radiation and proton beam.

DETAILED DESCRIPTION OF THE PREFERRED EMBODIMENT

The present invention will be described in detail hereinunder.

Radiation Sensitive Composition (A) Inorganic Oxide Particles

The inorganic oxide particles in the present invention are not particularly limited but preferably are stable to a radical or cation produced from the radiation sensitive polymerization initiator (D) which will be described hereinafter, hardly absorb radiation applied thereto when it passes the particles and have high optical transparency. The refractive index of the inorganic oxide particles can be suitably selected according to the application purpose of the microlens.

The inorganic oxide particles are preferably oxide particles containing an atom such as Be, Mg, Ca, Sr, Ba, Sc, Y, La, Ce, Gd, Tb, Dy, Yb, Lu, Ti, Zr, Hf, Nb, Mo, W, Zn, B, Al, Si, Ge, Sn, Pb, Bi or Te. Specific examples of the inorganic oxide particles include oxide particles such as BeO, MgO, CaO, SrO, BaO, $Sc_2O_3$, $Y_2O_3$, $La_2O_3$, $Ce_2O_3$, $Gd_2O_3$, $Tb_2O_3$, $Dy_2O_3$, $Yb_2O_3$, $Lu_2O_3$, $TiO_2$, $ZrO_2$, $HfO_2$, $Nb_2O_5$, $MoO_3$, $WO_3$, ZnO, $B_2O_3$, $Al_2O_3$, $SiO_2$, $GeO_2$, $SnO_2$, PbO, $Bi_2O_3$ and $TeO_2$; and composite oxide particles consisting of two or more components including the above oxide, such as $Al_2O_3$—MgO, $Al_2O_3$—$SiO_2$, ZnO—$Y_2O_3$, $ZrO_2$—$Ce_2O_3$, $ZrO_2$—$TiO_2$—$SnO_2$, $TeO_2$—BaO—ZnO, TeO₂—WO₃—Ta₂O₅, TeO₂—WO₃—Bi₂O₃, TeO₂—BaO—PbO, CaO—Al₂O₃, CaO—Al₂O₃—BaO, CaO—Al₂O₃—Na₂O, CaO—Al₂O₃—K₂O, CaO—Al₂O₃—SiO₂, PbO—Bi₂O₃—BaO, PbO—Bi₂O₃—ZnO, PbO—Bi₂O₃, PbO—Bi₂O₃—BaO—ZnO, PbO—Bi₂O₃—CdO—Al₂O₃, PbO—Bi₂O₃—GeO₂, PbO—Bi₂O₃—GeO₂—Ti₂O, BaO—PbO—Bi₂O₃, BaO—PbO—Bi₂O₃—ZnO, Bi₂O₃—Ga₂O₃—PbO, Bi₂O₃—Ga₂O₃—CdO and Bi₂O₃—Ga₂O₃—PbO—CdO.

These inorganic oxide particles may be used alone or in combination of two or more.

The inorganic oxide particles may be used after their surfaces are modified by treating with a silane coupling agent, surfactant or a compound which can be coordinately bonded to a metal atom constituting the oxide.

The average particle diameter of the inorganic oxide particles is preferably 1 µm or less. The average particle diameter is desirably smaller than the wavelength of the radiation, more preferably 0.5 µm or less, much more preferably 0.1 µm or less. When the average particle diameter of the inorganic oxide particles is larger than 1 µm, the transparency of the obtained radiation sensitive composition may lower or the coating film of the composition may have a problem with its surface state.

The particle size distribution measured by the dynamic light scattering method of the inorganic oxide particles is preferably narrow. The shape of the inorganic oxide particles is not particularly limited but preferably spherical or almost spherical because the scattering of the radiation rarely occurs.

In the present invention, the inorganic oxide particles may be prepared as a dispersion by mixing and dispersing the inorganic oxide particles in a suitable solvent with a mixer such as a ball mill or rod mill.

Examples of the solvent used for the preparation of the above dispersion include alcohols such as 1-propanol, 2-propanol, 1-butanol, 2-butanol, 2-methyl-2-propanol, 1-pentanol, 2-pentanol, 3-pentanol, 3-methyl-1-butanol, 2-methyl-2-butanol, neopentanol, cyclopentanol, 1-hexanol and cyclohexanol in addition to the same solvents to be enumerated for the preparation of a liquid radiation sensitive composition which will be described hereinafter.

These solvents may be used alone or in combination of two or more.

(B) Copolymer

The component (B) in the present invention is a copolymer (to be referred to as "copolymer (B)" hereinafter) of at least one unsaturated compound selected from the group consisting of an unsaturated carboxylic acid and an unsaturated carboxylic anhydride (to be referred to as "compound (b1)" hereinafter) and other unsaturated compound (to be referred to as "compound (b2)" hereinafter) different from the above compound (b1).

The compound (b1) preferably has one ethylenically unsaturated group in the molecule.

Examples of the compound (b1) include unsaturated monocarboxylic acids such as (meth)acrylic acid and crotonic acid; unsaturated dicarboxylic acids such as maleic acid, fumaric acid, citraconic acid, mesaconic acid and itaconic acid; and anhydrides thereof.

Out of the above compounds (b1), (meth)acrylic acid and maleic anhydride are preferred from the viewpoints of copolymerization reactivity, solubility in an alkali developer and easy acquisition.

The above compounds (b1) may be used alone or in combination of two or more.

The compound (b2) is selected from an aromatic vinyl compound, unsaturated carboxylic acid ester, unsaturated carboxylic acid aminoalkyl ester, unsaturated carboxylic acid ester having an epoxy group, unsaturated carboxylic acid thioester, carboxylic acid vinyl ester, unsaturated ether, vinyl cyanide compound, unsaturated amide, N-substituted maleimide, aliphatic conjugated diene and macromonomer.

Illustrative examples of the compound (b2) are given below.

Examples of the aromatic vinyl compound include styrene, α-methylstyrene, o-vinyltoluene, m-vinyltoluene, p-vinyltoluene, p-chlorostyrene, o-methoxystyrene, m-methoxystyrene, p-methoxystyrene, p-vinylbenzyl methyl ether, p-vinylbenzyl glycidyl ether, vinylthiobenzene, bis(4-vinylthiophenyl)sulfide and indene.

Examples of the unsaturated carboxylic acid ester include methyl acrylate, methyl methacrylate, ethyl acrylate, ethyl methacrylate, n-propyl acrylate, n-propyl methacrylate, i-propyl acrylate, i-propyl methacrylate, n-butyl acrylate, n-butyl methacrylate, i-butyl acrylate, i-butyl methacrylate, sec-butyl acrylate, sec-butyl methacrylate, t-butyl acrylate, t-butyl methacrylate, 2-hydroxyethyl acrylate, 2-hydroxyethyl methacrylate, 2-hydroxypropyl acrylate, 2-hydroxypropyl methacrylate, 3-hydroxypropyl acrylate, 3-hydroxypropyl methacrylate, 2-hydroxybutyl acrylate, 2-hydroxybutyl methacrylate, 3-hydroxybutyl acrylate, 3-hydroxybutyl methacrylate, 4-hydroxybutyl acrylate, 4-hydroxybutyl methacrylate, allyl acrylate, allyl methacrylate, benzyl acrylate, benzyl methacrylate, phenyl acrylate, phenyl methacrylate, p-chlorophenyl acrylate, p-chlorophenyl methacrylate, 1-naphthyl acrylate, 1-naphthyl methacrylate, dicyclopentanyl acrylate, dicyclbpentanyl methacrylate, 2-methoxyethyl acrylate, 2-methoxyethyl methacrylate, methoxydiethylene glycol acrylate, methoxydiethylene glycol methacrylate, methoxytriethylene glycol acrylate, methoxytriethylene glycol methacrylate, methoxydipropylene glycol acrylate, methoxydipropylene glycol methacrylate, glycerin monoacrylate and glycerin monomethacrylate.

Examples of the unsaturated carboxylic acid aminoalkyl ester include 2-aminoethyl acrylate, 2-aminoethyl methacrylate, 2-dimethylaminoethyl acrylate, 2-dimethylaminoethyl methacrylate, 2-aminopropyl acrylate, 2-aminopropyl methacrylate, 2-dimethylaminopropyl acrylate, 2-dimethylaminopropyl methacrylate, 3-aminopropyl acrylate, 3-aminopropyl methacrylate, 3-dimethylaminopropyl acrylate and 3-dimethylaminopropyl methacrylate.

Examples of the unsaturated carboxylic acid ester having an epoxy group include glycidyl acrylate, glycidyl methacrylate, β-methylglycidyl acrylate, β-methylglycidyl methacrylate, and compounds represented by the following formula (1):

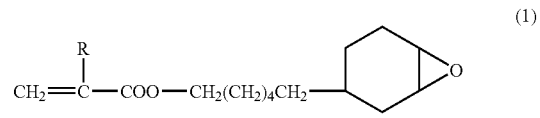

wherein R is a hydrogen or methyl group.

Examples of the unsaturated carboxylic acid thioester include methyl thioacrylate, methyl thiomethacrylate, ethyl thioacrylate, ethyl thiomethacrylate, n-propyl thioacrylate, n-propyl thiomethacrylate, benzyl thioacrylate, benzyl thiomethacrylate, phenyl thioacrylate, phenyl thiomethacrylate, p-chlorophenyl thioacrylate, p-chlorophenyl thiomethacrylate, 1-naphthyl thioacrylate, 1-naphthyl thiomethacrylate, bis(4-acryloylthiophenyl)sulfide and bis(4-methacryloylthiophenyl)sulfide.

Examples of the carboxylic acid vinyl ester include vinyl acetate, vinyl propionate, vinyl butyrate and vinyl benzoate. Examples of the unsaturated ether include vinyl methyl ether, vinyl ethyl ether, allyl glycidyl ether, methacryl glycidyl ether.

Examples of the vinyl cyanide compound include acrylonitrile, methacrylonitrile, α-chloroacrylonitrile and vinylidene cyanide.

Examples of the unsaturated amide include acrylamide, methacrylamide, α-chloroacrylamide, N-(2-hydroxyethyl)acrylamide, N-(2-hydroxyethyl)methacrylamide, N-methylolacrylamide and N-methylolmethacrylamide.

Examples of the N-substituted maleimide include N-cyclohexylmaleimide, N-phenylmaleimide, N-o-hydroxyphenylmaleimide, N-m-hydroxyphenylmaleimide, N-p-hydroxyphenylmaleimide, N-o-methylphenylmaleimide, N-m-methylphenylmaleimide, N-p-methylphenylmaleimide, N-o-methoxyphenylmaleimide, N-m-methoxyphenylmaleimide and N-p-methoxyphenylmaleimide.

Examples of the aliphatic conjugated diene include 1,3-butadiene, isoprene and chloroprene.

Examples of the macromonomer include compounds having an acryloyl group or methacryloyl group at one terminal of a polymer molecular chain, such as polystyrene, polymethyl acrylate, polymethyl methacrylate, poly-n-butyl acrylate, poly-n-butyl methacrylate and polysiloxane.

These compounds (b2) may be used alone or in combination of two or more.

In the copolymer (B), the content of a recurring unit derived from the compound (b1) is preferably 5 to 50 wt %, particularly preferably 15 to 40 wt %. When the content of the recurring unit derived from the compound (b1) is lower than 5 wt %, the solubility in an alkali developer may deteriorate and when the content is higher than 50 wt %, the solubility in an alkali developer may become excessive or the strength of the microlens may lower.

The weight average molecular weight in terms of polystyrene (to be referred to as "Mw" hereinafter) of the copolymer (B) is preferably 2,000 to 100,000, more preferably 5,000 to 50,000. When Mw of the copolymer (B) is lower than 2,000, the alkali developability or film residual rate may lower, or the pattern shape and heat resistance may deteriorate. When Mw is higher than 100,000, the sensitivity may lower or the pattern shape may become worse.

The ratio (to be referred to as "Mn/Mw" hereinafter) of the number average molecular weight in terms of polystyrene (to be referred to as "Mn" hereinafter) to Mw of the copolymer (B) is preferably 1.0 to 5.0, more preferably 1.0 to 3.0.

The copolymer (B) can be prepared by the radical polymerization of the compounds (b1) and (b2) in a suitable solvent in the presence of a polymerization initiator.

Examples of the solvent used for the above radical polymerization include alcohols such as methanol and ethanol; ethers such as tetrahydrofuran; ethylene glycol alkyl ethers such as ethylene glycol monomethyl ether and ethylene glycol monoethyl ether; ethylene glycol monoalkyl ether acetates such as ethylene glycol monomethyl ether acetate and ethylene glycol monoethyl ether acetate; diethylene glycol alkyl ethers such as diethylene glycol monomethyl ether, diethylene glycol monoethyl ether, diethylene glycol dimethyl ether, diethylene glycol diethyl ether and diethylene glycol ethyl methyl ether; propylene glycol alkyl ethers such as propylene glycol monomethyl ether, propylene glycol monoethyl ether, propylene glycol mono-n-propyl ether and propylene glycol mono-n-butyl ether; propylene glycol monoalkyl ether acetates such as propylene glycol monomethyl ether acetate, propylene glycol monoethyl ether acetate, propylene glycol mono-n-propyl ether acetate and propylene glycol mono-n-butyl ether acetate; propylene glycol monoalkyl ether propionates such as propylene glycol monomethyl ether propionate, propylene glycol ethyl monoether propionate, propylene glycol mono-n-propyl ether propionate and propylene glycol mono-n-butyl ether propionate; aromatic hydrocarbons such as toluene and xylene; ketones such as methyl ethyl ketone, cyclohexanone and 4-hydroxy-4-methyl-2-pentanone; and other esters such as methyl acetate, ethyl acetate, n-propyl acetate, n-butyl acetate, methyl hydroxyacetate, ethyl hydroxyacetate, butyl hydroxyacetate, methyl lactate, ethyl lactate, n-propyl lactate, n-butyl lactate, methyl 3-hydroxypropionate, ethyl 3-hydroxypropionate, n-propyl 3-hydroxypropionate, n-butyl 3-hydroxypropionate, methyl 2-hydroxy-2-methylpropionate, ethyl 2-hydroxy-2-methylpropionate, methyl 2-hydroxy-3-methylbutanoate, methyl methoxyacetate, ethyl methoxyacetate, n-propyl methoxyacetate, n-butyl methoxyacetate, methyl ethoxyacetate, ethyl ethoxyacetate, n-propyl ethoxyacetate, n-butyl ethoxyacetate, methyl n-propoxyacetate, ethyl n-propoxyacetate, n-propyl n-propoxyacetate, n-butyl n-propoxyacetate, methyl n-butoxyacetate, ethyl n-butoxyacetate, n-propyl n-butoxyacetate, n-butyl n-butoxyacetate, methyl 2-methoxypropionate, ethyl 2-methoxypropionate, n-propyl 2-methoxypropionate, n-butyl 2-methoxypropionate, methyl 2-ethoxypropionate, ethyl 2-ethoxypropionate, n-propyl 2-ethoxypropionate, n-butyl 2-ethoxypropionate, methyl 2-n-butoxypropionate, ethyl 2-n-butoxypropionate, n-propyl 2-n-butoxypropionate, n-butyl 2-n-butoxypropionate, methyl 3-methoxypropionate, ethyl 3-methoxypropionate, n-propyl 3-methoxypropionate, n-butyl 3-methoxypropionate, methyl 3-ethoxypropionate, ethyl 3-ethoxypropionate, n-propyl 3-ethoxypropionate, n-butyl 3-ethoxypropionate, methyl 3-n-propoxypropionate, ethyl 3-n-propoxypropionate, n-propyl 3-n-propoxypropionate, n-butyl 3-n-propoxypropionate, methyl 3-n-butoxypropionate, ethyl 3-n-butoxypropionate, n-propyl 3-n-butoxypropionate and n-butyl 3-n-butoxypropionate. These solvents may be used alone or in combination of two or more.

As the polymerization initiator used for the above radical polymerization may be used a generally known radical polymerization initiator. Examples of the known radical polymerization initiator include azo compounds such as 2,2'-azobisisobutyronitrile, 2,2'-azobis-(2,4-dimethylvaleronitrile) and 2,2'-azobis(4-methoxy-2,4-dimethylvaleronitrile); organic peroxides such as benzoyl peroxide, lauroyl peroxide, t-butyl peroxypivalate and 1,1'-bis-(5-butylperoxy)cyclohexane; and hydrogen peroxide. When a peroxide is used as the radical polymerization initiator, a reducing agent may be used in combination with the radical polymerization initiator as a redox initiator.

The amount of the copolymer (B) in the present invention is preferably 10 to 1,000 parts by weight, more preferably 100 to 500 parts by weight based on 100 parts by weight of the inorganic oxide particles (A). When the amount of the copolymer (B) is smaller than 10 parts by weight, the alkali developability may lower or the residue, stain or film residue may be produced on the substrate or light screening layer of the unexposed part and when the amount is larger than 1,000 parts by weight, it may be difficult to achieve a high refractive index.

(C) Polyfunctional Unsaturated Compound

The polyfunctional unsaturated compound has at least two ethylenically unsaturated groups in the molecule. Examples of the polyfunctional unsaturated monomer include diacrylates and dimethacrylates of alkylene glycols such as ethylene glycol and propylene glycol; diacrylates and dimethacrylates of polyalkylene glycols such as polyethylene glycol other than diethylene glycol and polypropylene glycols other than dipropylene glycol; polyacrylates and polymethacrylates of polyhydric alcohols having a functionality of 3 or more such as glycerin, trimethylolpropane, pentaerythritol and dipentaerythritol, and dicarboxylic acid modified products thereof; oligoacrylates and oligomethacrylates of a polyester, epoxy resin, urethane resin, alkyd resin, silicone resin and spiran resin; diacrylates and dimethacrylates of polymers having a hydroxyl group at both terminals such as polybutadiene having a hydroxyl group at both terminals, polyisoprene having a hydroxyl group at both terminals and polycaprolactone having a hydroxyl group at both terminals; and tris(2-acryloyloxyethyl)phosphate and tris(2-methacryloyloxyethyl)phosphate.

Out of these polyfunctional unsaturated compounds, polyacrylates and polymethacrylates of polyhydric alcohols having a functionality of 3 or more and dicarboxylic acid modified products thereof are preferred, as exemplified by trimethylolpropane triacrylate, trimethylolpropane trimethacrylate, pentaerythritol triacrylate, pentaerythritol trimethacrylate, succinic acid modified pentaerythritol triacrylate, succinic acid modified pentaerythritol trimethacrylate, pentaerythritol tetraacrylate, pentaerythritol tetramethacrylate, dipentaerythritol hexaacrylate, dipentaerythritol hexamethacrylate, tris(2-acryloyloxyethyl)phosphate and tris(2-methacryloyloxyethyl)phosphate.

The above polyfunctional unsaturated compounds may be used alone or in combination of two or more.

The amount of the polyfunctional unsaturated compound in the present invention is preferably 5 to 500 parts by weight, more preferably 20 to 300 parts by weight, particularly preferably 30 to 100 parts by weight based on 100 parts by weight of the copolymer (B). When the amount of the polyfunctional unsaturated compound is smaller than 5 parts by weight, the hardness of the obtained microlens may lower and when the amount is larger than 500 parts by weight, the alkali developability may deteriorate, or a stain or film residue may be produced on an area other than the pattern formed area.

(D) Radiation Sensitive Polymerization Initiator

The radiation sensitive polymerization initiator in the present invention is a component for forming a radical or cation capable of initiating the polymerization of the polyfunctional unsaturated compound (C) upon exposure to radiation. The polymerization initiator which forms a radical upon exposure to radiation will be referred to as "radiation sensitive radical polymerization initiator" and the polymerization initiator which forms a cation upon exposure to radiation will be referred to as "radiation sensitive cation polymerization initiator" hereinafter.

In the present invention, a suitable radiation sensitive polymerization initiator must be selected according to whether radiation is applied under an oxygen-free atmosphere or an oxygen atmosphere. That is, when radiation is applied in an oxygen-free atmosphere, any radiation sensitive radical polymerization initiator or any radiation sensitive cation polymerization initiator may be used. When radiation is applied in an oxygen atmosphere, as the formed cation is rarely deactivated by oxygen, any radiation sensitive cation polymerization initiator may be used. However, as the formed radical may be deactivated by oxygen to reduce its sensitivity, the film residual rate and surface hardness of the exposed part of a microlens may be unsatisfactory. Therefore, a suitable radiation sensitive radical polymerization initiator must be selected.

Examples of the radiation sensitive radical polymerization initiator include α-diketones such as benzyl and diacetyl; acyloins such as benzoin; acyloin ethers such as benzoin methyl ether, benzoin ethyl ether and benzoin isopropyl ether; thioxanthones such as thioxanthone, 2,4-diethylthioxanthone and thioxanthone-4-sulfone; benzophenones such as benzophenone, 4,4'-bis(dimethylamino)benzophenone and 4,4'-bis(diethylamino)benzophenone; acetophenones such as acetophenone, p-dimethylaminoacetophenone, α,α'-dimethoxyacetophenone, 2,2'-dimethoxy-2-phenylacetophenone, p-methoxyacetophenone, 2-methyl[4-(methylthio)phenyl]-2-morpholinopropanone-1 and 2-benzyl-2-dimethylamino-1-(4-morpholinophenyl)butanone-1; quinines such as anthraquinone and 1,4-naphthoquinone; halogen compounds such as phenacyl chloride, tribromomethylphenyl sulfone and tris(trichloromethyl)-s-triazine; acylphosphine oxides such as 2,4,6-trimethylbenzoyldiphenylphosphine oxide; and peroxides such as di-t-butyl peroxide.

Commercially available products of the radiation sensitive radical polymerization initiator include IRGACURE-184, -369, -500, -651, -907 and -1700, and Darocur-1173, -1116, -2959, -1664 and -4043 (of CHIBA SPECIALITY CHEMICALS Co., Ltd.), KAYACURE-DETX, -MBP, -DMBI, -EPA and -OA (of Nippon Kayaku Co., Ltd.), VICURE-10 and -55 (of STUFFER Co., Ltd.), TRIGONALP1 (of AKZO Co., Ltd.), SANDORAY 1000 (of SANDOZ Co., Ltd.), DEAP (of APJOHN Co., Ltd.), QUANTACURE-PDO, -ITX and -EPD (of WARD BLEKINSOP Co., Ltd.), and Lucirin TPO, LR8953 and TPO-L (of BASF Co., Ltd.).

The above radiation sensitive radical polymerization initiators may be used alone or in combination of two or more.

Examples of the radiation sensitive cation polymerization initiator include phenyldiazonium tetrafluoroborate, phenyldiazonium hexafluorophosphonate, phenyldiazonium hexafluoroarsenate, phenyldiazonium trifluoromethane sulfonate, phenyldiazonium trifluoroacetate, phenyldiazonium-p-toluene sulfonate, 4-methoxyphenyldiazonium tetrafluoroborate, 4-methoxyphenyldiazonium hexafluorophosphonate and 4-methoxyphenyldiazonium hexafluoroarsenate.

Commercially available products of the radiation sensitive cation polymerization initiator include Adeca Ultraset PP-33 (of Asahi Denka Kogyo K.K.), OPTOMER SP-150 and -170 (of Asahi Denka Kogyo K.K.), and Irgacure 261 (of CHIBA SPECIALITY CHEMICALS Co., Ltd.).

The above radiation sensitive cation polymerization initiators may be used alone or in combination of two or more.

The amount of the radiation sensitive polymerization initiator in the present invention is preferably 1 to 200 parts by weight, more preferably 5 to 120 parts by weight, particularly preferably 5 to 100 parts by weight based on 100 parts by weight of the polyfunctional unsaturated monomer (C). When the amount of the radiation sensitive polymerization initiator is smaller than 1 part by weight, it may be difficult to form a pattern and when the amount is larger than 200 parts by weight, the formed pattern may easily fall off from the substrate at the time of development, or the residue, stain or film residue may be produced on the substrate or the light screening layer of the unexposed part.

In the present invention, a high-sensitivity radiation sensitive composition which is rarely deactivated by oxygen can be obtained by further using at least one of a sensitizer, curing promoter and macromolecular photocrosslinking agent/sensitizer in combination with the radiation sensitive polymerization initiator.

Examples of the above sensitizer include 4-diethylaminoacetophenone, 4-dimethylaminopropiophenone, ethyl 4-dimethylaminobenzoate, 2-ethylhexyl 4-dimethylaminobenzoate, 2,5-bis(4-diethylaminobenzal)cyclohexanone, 7-diethylamino-3-(4-diethylaminobenzoyl)coumarin and 4-(diethylamino)chalcone.

These sensitizers may be used alone or in combination of two or more.

Examples of the above curing promoter include chain transfer agents such as 2-mercaptobenzimidazole, 2-mercaptobenzothiazole, 2-mercaptobenzoxazole, 2,5-dimercapto-1,3,4-thiadiazole and 2-mercapto-4,6-dimethylaminopyridine.

These curing promoters may be used alone or in combination of two or more.

The above macromolecular photocrosslinking agent/sensitizer is a macromolecular compound having at least one functional group in the main chain and/or side chain which can serve as a crosslinking agent and/or sensitizer upon exposure. Examples of the macromolecular compound include a condensate of 4-azidobenzaldehyde and polyvinyl alcohol, condensate of 4-azidobenzaldehyde and phenol novolak resin, (co)polymers of 4-acryloylphenyl cinnamate, 1,4-polybutadiene and 1,2-polybutadiene.

These macromolecular photocrosslinking agents/sensitizers may be used alone or in combination of two or more.

The total amount of the sensitizer, curing promoter and macromolecular photocrosslinking agent/sensitizer in the present invention is preferably 300 parts or less by weight, more preferably 200 parts or less by weight based on 100 parts by weight of the radiation sensitive polymerization initiator.

Other Additives

The radiation sensitive composition of the present invention may optionally contain other additives.

One of the other additives is an organic acid.

The organic acid is preferably an aliphatic carboxylic acid or phenyl group-containing carboxylic acid.

Examples of the aliphatic carboxylic acid include monocarboxylic acids such as formic acid, acetic acid, propionic acid, butyric acid, valeric acid, pivalic acid, caproic acid, diethylacetic acid, enanthic acid and caprylic acid; dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid, cyclohexanedicarboxylic acids, itaconic acid, citraconic acid, maleic acid, fumaric acid and mesaconic acid; and tricarboxylic acids such as tricarballylic acid, aconitic acid and camphoronic acid.

The phenyl group-containing carboxylic acid is an aromatic carboxylic acid having a carboxyl group directly bonded to a phenyl group or carboxylic acid having a carboxyl group bonded to a phenyl group through a carbon chain. Examples of the phenyl group-containing carboxylic acid include aromatic monocarboxylic acids such as benzoic acid, toluic acid, cuminic acid, hemellitic acid and mesitylenic acid; aromatic dicarboxylic acids such as phthalic acid, isophthalic acid and terephthalic acid; aromatic polycarboxylic acids having 3 or more carboxyl groups such as trimellitic acid, trimesic acid, mellophanic acid and pyromellitic acid; and phenylacetic acid, hydroatropic acid, hydrocinnamic acid, mandelic acid, phenylsuccinic acid, atropic acid, cinnamic acid, cinnamylidenic acid, coumaric acid and umbellic acid.

Out of these organic acids, aliphatic dicarboxylic acids and aromatic dicarboxylic acids such as malonic acid, adipic acid, itaconic acid, citraconic acid, fumaric acid, mesaconic acid and phthalic acid are preferred from the viewpoints of solubility in the solvent which will be described hereinafter, solubility in an alkali developer and the difficult of producing a stain or film residue on the substrate or light screening layer of the unexposed part.

The above organic acids may be used alone or in combination of two or more.

The amount of the organic acid in the present invention is preferably 10 wt % or less, more preferably 5 wt % or less, particularly preferably 1 wt % or less based on the total of the radiation sensitive composition excluding the solvent. When the amount of the organic acid is larger than 10 wt %, the adhesion of the formed pattern to the substrate may lower.

Additives other than the above organic acid include a dispersion aid such as blue pigment derivative or yellow pigment derivative exemplified by copper phthalocyanine derivatives; filler such as glass or alumina; macromolecular compound such as polyvinyl alcohol, polyethylene glycol monoalkyl ether or poly(fluoroalkylacrylate); surfactant such as nonionic surfactant, cationic surfactant or anionic surfactant; adhesion promoter such as vinyltrimethoxysilane, vinyltriethoxysilane, vinyl tris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloyloxypropyltrimethoxysilane or 3-mercaptopropyltrimethoxysilane; antioxidant such as 2,2-thiobis(4-methyl-6-t-butylphenol) or 2,6-di-t-butylphenol; ultraviolet light absorber such as 2-(3-t-butyl-5-methyl-2-hydroxyphenyl)-5-chlorobenzotriazole or alkoxybenzophenone; and agglomeration inhibitor such as sodium polyacrylate.

Solvent

The radiation sensitive composition of the present invention comprises the above components (A), (B), (C) and (D) and optional additives and is preferably prepared as a liquid composition by further mixing a solvent.

The above solvent disperses or dissolves the above components constituting the radiation sensitive composition, does not react with these components and has suitable volatility.

The solvent is preferably a (poly)alkylene glycol monoalkyl ether, (poly)alkylene glycol monoalkyl ether acetate, other ether, ketone, alkyl lactate, other ester, aromatic hydrocarbon or amide.

Illustrative examples of the solvent are given below.

Examples of the (poly)alkylene glycol monoalkyl ether include ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether and tripropylene glycol monoethyl ether.

Examples of the (poly)alkylene glycol monoalkyl ether acetate include ethylene glycol monomethyl ether acetate, ethylene glycol monoethyl ether acetate, diethylene glycol monomethyl ether acetate, diethylene glycol monoethyl ether acetate, propylene glycol monomethyl ether acetate and propylene glycol monoethyl ether acetate.

Examples of the other ether include diethylene glycol dimethyl ether, diethylene glycol ethyl methyl ether, diethylene glycol diethyl ether and tetrahydrofuran.

Examples of the ketone include methyl ethyl ketone, methyl isobutyl ketone, 2-heptanone, 3-heptanone and cyclohexanone.

Examples of the alkyl lactate include methyl lactate and ethyl lactate.

Examples of the other ester include ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutyrate, 3-methyl-3-methoxybutylacetate, 3-methyl-3-methoxybutylpropionate, ethyl acetate, n-propyl acetate, i-propyl acetate, n-butyl acetate, i-butyl acetate, n-pentyl formate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate and ethyl 2-oxobutanoate.

Examples of the aromatic hydrocarbon include toluene and xylene.

Examples of the amide include N-methylpyrrolidone, N,N-dimethylformamide and N,N-dimethylacetamide.

Out of these solvents, propylene glycol monomethyl ether, ethylene glycol monomethyl ether acetate, propylene glycol monomethyl ether acetate, propylene glycol monoethyl ether acetate, diethylene glycol dimethyl ether, diethylene glycol methyl ethyl ether, methyl ethyl ketone, methyl isobutyl ketone, 2-heptanone, 3-heptanone, cyclohexanone, ethyl lactate, ethyl 3-methoxypropionate, methyl 3-ethoxypropionate, ethyl 3-ethoxypropionate, 3-methyl-3-methoxybutylpropionate, n-butyl acetate, i-butyl acetate, n-pentyl formate, i-pentyl acetate, n-butyl propionate, ethyl butyrate, i-propyl butyrate, n-butyl butyrate and ethyl pyruvate are preferred from the viewpoints of solubility, the dispersibility of the inorganic oxide particles (A) and coatability.

The above solvents may be used alone or in combination of two or more.

A high-boiling solvent such as benzyl ethyl ether, di-n-hexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate or ethylene glycol monophenyl ether acetate may be used in conjunction with the above solvent.

The above high-boiling solvents may be used alone or in combination of two or more.

When a high-boiling solvent is used, the amount of the high-boiling solvent is preferably 30 wt % or less, more preferably 25 wt % or less based on the total amount of the solvents.

The amount of the solvent in the present invention is not particularly limited but the total amount of all the components excluding the solvent of the composition is preferably 5 to 65 wt %, more preferably 10 to 55 wt % from the viewpoints of the coatability and stability of the obtained radiation sensitive composition.

The liquid composition thus prepared is preferably used after it is filtered with a Millipore filter having a pore size of about 1 μm.

The radiation sensitive composition of the present invention can be advantageously used for the formation of a microlens and a microlens array in particular.

Process for Forming a Microlens

The process for forming a microlens of the present invention comprises at least the following steps (1) to (4):
(1) applying the above radiation sensitive composition of the present invention to a substrate to form a coating film;
(2) applying radiation to at least part of the coating film to cure an exposed part;
(3) developing the coating film after exposure to remove an unexposed part; and
(4) heating the coating film after development.

These steps will be described hereinunder.

Step (1):

In this step, the radiation sensitive composition is applied to the surface of the substrate preferably as a liquid composition and then preferably pre-baked to remove the solvent so as to form a coating film on the substrate.

The substrate is, for example, a glass substrate, silicon wafer or a substrate having a metal layer on the surface of any one of the above substrates.

The technique of applying the radiation sensitive composition for color filters is not particularly limited and may be suitably selected from spray coating, roll coating, rotational coating and bar coating.

The prebaking conditions which differ according to the type and amount of each component include a prebaking at temperature of 60 to 110° C. and a prebaking time of 30 seconds to 15 minutes.

The thickness of the formed coating film is preferably about 0.5 to 20 μm after prebaking.

Step (2):

In this step, radiation is applied to at least part of the formed coating film to cure an exposed part. To apply radiation to at least part of the coating film, the radiation is applied through a mask having a predetermined pattern.

The radiation to be applied may be ultraviolet radiation such as g-ray or i-ray, far ultraviolet radiation such as KrF excimer laser beam or ArF excimer laser beam, X-radiation such as synchrotron radiation, or charged corpuscular beam such as electron beam. Out of these, ultraviolet radiation is preferred.

The amount of exposure is preferably about 50 to 2,000 J/m$^2$.

Step (3):

In this step, the coating film after exposure is developed with a developer, preferably an alkali developer to remove a radiation unexposed part in order to form a predetermined pattern.

Examples of the above alkali developer include aqueous solutions of sodium hydroxide, potassium hydroxide, sodium carbonate, sodium silicate, sodium metasilicate, ammonia, ethylamine, n-propylamine, diethylamine, diethylaminoethanol, di-n-propylamine, triethylamine, methyl diethylamine, dimethyl ethanolamine, triethanolamine, tetramethylammonium hydroxide, tetraethylammonium hydroxide, pyrrole, piperidine, 1,8-diazabicyclo[5.4.0]-7-undecene and 1,5-diazabicyclo[4.3.0]-5-nonene.

A water-soluble organic solvent such as methanol or ethanol, surfactant and organic solvent may be added to the alkali developer.

Puddle development, dip development, rocking immersion development or shower development may be suitably employed. After development with the alkali developer, the coating film is generally rinsed with running water.

The development time which differs according to the composition of the radiation sensitive composition is, for example, 30 to 120 seconds at normal temperature.

Step (4):

In this step, the coating film after development is post-baked with a heater such as a hot plate or oven to be further cured.

The post-baking temperature is preferably 120 to 250° C., more preferably 200 to 240° C. The post-baking time which differs according to heating means is 5 to 30 minutes when the coating film is heated on a hot plate and 30 to 90 minutes when it is heated in an oven.

Step post-baking in which heating is carried out two or more times may be employed.

The pattern corresponding to the microlens of interest can be thus formed on the substrate.

By the process for forming a microlens of the present invention, a high-definition microlens and microlens array having excellent characteristic properties can be formed easily at a high production yield.

Microlens

The microlens of the present invention is made of the radiation sensitive composition for forming a microlens of the present invention, has excellent balance among characteristic properties and can be extremely advantageously used in liquid crystal display devices for OA equipment, liquid crystal TV's, portable telephones and projectors, in image-forming optical systems for the on-chip color filters of facsimiles, electronic copiers and solid image pick-up devices, and in optical fiber connectors.

As described above, the radiation sensitive composition of the present invention has excellent storage stability and resolution as a liquid composition and can provide a high-definition microlens and microlens array having excellent balance among characteristic properties.

By the process for forming a microlens of the present invention, a high-definition microlens having excellent characteristic properties can be formed easily at a high production yield.

The microlens of the present invention has a high refractive index and excellent balance among characteristic properties such as transparency, heat resistance, thermal discoloration resistance and solvent resistance and can be advantageously used in liquid crystal display devices, in image-forming optical systems for the on-chip color filters of facsimiles, electronic copiers and solid image pick-up devices, and in optical fiber connectors.

EXAMPLES

The following synthetic examples, examples and comparative examples are provided for the purpose of further illustrating the present invention but are in no way to be taken as limiting.

Synthetic Example 1

7 parts by weight of 2,2'-azobis(2,4-dimethylvaleronitrile) and 220 parts by weight of propylene glycol monomethyl ether acetate were fed to a flask equipped with a cooling pipe and a stirrer, 25 parts by weight of methacrylic acid, 35 parts by weigh of dicyclopentanyl methacrylate, 40 parts by weight of β-methyl glycidyl methacrylate and 1.5 parts by weight of α-methylstyrene dimer were then fed to the flask, and stirring was started gently while the inside of the flask was substituted by nitrogen. Thereafter, the temperature of the reaction solution was raised to 70° C. to polymerize the solution at that temperature for 5 hours so as to obtain a polymer solution having a solids content of 31.2 wt % including the copolymer (B).

The obtained copolymer (B) had an Mw of 17,500 and an Mn/Mw of 1.7. This copolymer (B) was designated as "copolymer (B-1)".

Mw and Mn/Mw of the copolymer (B-1) and copolymers (B-2) to (B-6) below were measured by gel permeation chromatography (GPC) using the GPC-101 (trade name) of Showa Denko K.K.

Synthetic Example 2

7 parts by weight of 2,2'-azobis(2,4-dimethylvaleronitrile) and 220 parts by weight of methyl 2-hydroxypropionate were fed to a flask equipped with a cooling pipe and a stirrer, 20 parts by weight of styrene, 25 parts by weight of methacrylic acid, 20 parts by weigh of N-phenylmaleimide, 35 parts by weight of β-methyl glycidyl methacrylate and 1.5 parts by weight of α-methylstyrene dimer were then fed to the flask, and stirring was started gently while the inside of the flask was substituted by nitrogen. Thereafter, the temperature of the reaction solution was raised to 70° C. to polymerize the solution at that temperature for 5 hours so as to obtain a polymer solution having a solids content of 31.0 wt % including the copolymer (B).

The obtained copolymer (B) had an Mw of 21,000 and an Mn/Mw of 2.1. This copolymer (B) was designated as "copolymer (B-2)".

Synthetic Example 3

5 parts by weight of 2,2'-azobisisobutyronitrile and 200 parts by weight of ethylene glycol monoethyl ether were fed to a flask equipped with a cooling pipe and a stirrer, 20 parts by weight of styrene, 25 parts by weight of methacrylic acid, 20 parts by weight of N-phenylmaleimide, 35 parts by weigh of methyl methacrylate and 1.5 parts by weight of α-methylstyrene dimer were then fed to the flask, and stirring was started gently while the inside of the flask was substituted by nitrogen. Thereafter, the temperature of the reaction solution was raised to 80° C. to polymerize the solution at that temperature for 4 hours so as to obtain a polymer solution having a solids content of 34.8 wt % including the copolymer (B).

The obtained copolymer (B) had an Mw of 13,000 and an Mn/Mw of 2.2. This copolymer (B) was designated as "copolymer (B-3)".

Synthetic Example 4

5 parts by weight of 2,2'-azobisisobutyronitrile and 200 parts by weight of cyclohexanone were fed to a flask equipped with a cooling pipe and a stirrer, 15 parts by weight of styrene, 30 parts by weight of methacrylic acid, 5 parts by weight of N-phenylmaleimide, 25 parts by weigh of benzyl methacrylate and 25 parts by weight of benzyl acrylate were then fed to the flask, and stirring was started gently while the inside of the flask was substituted by nitrogen. Thereafter, the temperature of the reaction solution was raised to 80° C. to polymerize the solution at that temperature for 5 hours so as to obtain a polymer solution having a solids content of 34.3 wt % including the copolymer (B).

The obtained copolymer (B) had an Mw of 10,000 and an Mn/Mw of 1.7. This copolymer (B) was designated as "copolymer (B-4)".

Synthetic Example 5

7 parts by weight of 2,2'-azobis(2,4-dimethylvaleronitrile) and 220 parts by weight of diethylene glycol ethyl methyl ether were fed to a flask equipped with a cooling pipe and a stirrer, 20 parts by weight of styrene, 30 parts by weight of methacrylic acid, 50 parts by weight of a compound represented by the following formula (2) (trade name: CYCLOMER M100, manufactured by Daicel Chemical Industries, Ltd.) and 2.0 parts by weight of α-methylstyrene dimer were then fed to the flask, and stirring was started gently while the inside of the flask was substituted by nitrogen. Thereafter, the temperature of the reaction solution was raised to 70° C. to polymerize the solution at that temperature for 5 hours so as to obtain a polymer solution having a solids content of 30.9 wt % including the copolymer (B).

The obtained copolymer (B) had an Mw of 21,000 and an Mn/Mw of 1.8. This copolymer (B) was designated as "copolymer (B-5)".

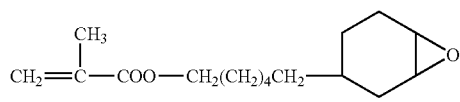

(2)

Synthetic Example 6

7 parts by weight of 2,2'-azobis(2,4-dimethylvaleronitrile) and 220 parts by weight of diethylene glycol ethyl methyl ether were fed to a flask equipped with a cooling pipe and a stirrer, 20 parts by weight of styrene, 30 parts by weight of methacrylic acid, 20 parts by weight of phenyl thiomethacrylate and 30 parts by weight of 2-hydroxybutyl acrylate were then fed to the flask, and stirring was started gently while the inside of the flask was substituted by nitrogen. Thereafter, the temperature of the reaction solution was raised to 70° C. to polymerize the solution at that temperature for 5 hours so as to obtain a polymer solution having a solids content of 30.9 wt % including the copolymer (B).

The obtained copolymer (B) had an Mw of 16,000 and an Mn/Mw of 1.8. This copolymer (B) was designated as "copolymer (B-6)".

Example 1

Preparation of Liquid Composition

A dispersion prepared by dispersing 120 parts by weight of $TiO_2$ particles having an average particle diameter of 0.05 µm as the inorganic oxide particles (A) in 220 parts by weight of propylene glycol monomethyl ether acetate, a polymer solution containing 100 parts by weight of the copolymer (B-1) obtained in Synthetic Example 1 as the copolymer (B), 70 parts by weight of tris(2-acryloyloxyethyl)phosphate as the polyfunctional unsaturated compound (C), 30 parts by weight of 2-benzyl-2-dimethylamino-1-(4-morpholinophenyl)butanone-1 as the radiation sensitive polymerization initiator (D) and 1,000 parts by weight of propylene glycol monomethyl ether acetate as the solvent were mixed together and the obtained mixture was filtered with a Millipore filter having a pore size of 1.0 µm to prepare a liquid radiation sensitive composition (S-1).

Then the storage stability of the liquid composition (S-1) was evaluated by the following method. The evaluation result is shown in Table 1.

Evaluation of Storage Stability

The liquid composition (S-1) was heated in an oven at 40° C. for 1 week to evaluate its storage stability based on an increase in viscosity before and after heating. When the increase in viscosity is 5% or less, it can be said that the storage stability is excellent.

Formation of Patterned Thin Film

The liquid composition (S-1) was applied to a glass substrate with a spinner and prebaked on a hot plate at 90° C. for 2 minutes to form a 4.7 µm-thick coating film.

Then, ultraviolet radiation having an intensity of 400 W/m$^2$ at a wavelength of 365 nm was applied to the obtained coating film through a predetermined pattern mask for 5 seconds. The coating film was then developed with a shower of a 1.0 wt % aqueous solution of tetramethylammonium hydroxide at 25° C. for 1 minute and rinsed with pure water for 1 minute to remove an unrequired portion so as to form a pattern.

After ultraviolet radiation having an intensity of 400 W/m$^2$ at a wavelength of 365 nm was applied to the obtained pattern for 10 seconds, the pattern was heated in an oven at 200° C. for 60 minutes to be cured so as to obtain a patterned thin film.

The thin film was evaluated by the following methods. The evaluation results are shown in Table 1.

Evaluation of Resolution

The resolution of the patterned thin film was evaluated as ○ when a line-and-space pattern (1L1S) having a line width of 20 µm could be resolved, Δ when a line-and-space pattern having a line width of 25 µm could be resolved, and X when the line-and-space pattern having a line width of 25 µm could not be resolved.

Evaluation of Refractive Index

The refractive index of the patterned thin film was measured with the MODEL2010 (trade name, manufactured by METRICON Co., Ltd.) prism coupler and the #200-P-1 or #200-P-2 measurement prism at a wavelength of 633 nm.

Evaluation of Transparency

The transparency of the patterned thin film was measured with the 150-20 Double Beam (trade name, manufactured by Hitachi, Ltd.) spectrophotometer at a wavelength of 400 nm. When the transparency is higher than 90%, it can be said that the transparency is excellent.

Evaluation of Heat Resistance

The patterned thin film was heated in an oven at 220° C. for 60 minutes to evaluate its heat resistance based on a reduction in film thickness before and after heating. When the reduction in film thickness is 5% or less, it can be said that the heat resistance of the film is excellent.

Evaluation of Thermal Discoloration Resistance

The patterned thin film was heated in an oven at 220° C. for 60 minutes to evaluate its transparency after heating in the same manner as the evaluation of transparency. When the reduction in transparency after heating is 5% or less, it can be said that the thermal discoloration resistance is excellent.

Evaluation of Solvent Resistance

A glass substrate having the patterned thin film was immersed in N-methylpyrrolidone maintained at 50° C. for 15 minutes to evaluate the solvent resistance of the thin film based on a change in its film thickness before and after immersion. When the change in film thickness is ±5% or less, it can be said that the solvent resistance is excellent.

Example 2

A liquid composition (S-2) was prepared in the same manner as in Example 1 except that a polymer solution containing 100 parts by weight of the copolymer (B-2) obtained in Synthetic Example 2 was used as the copolymer (B) and 800 parts by weight of methyl 2-hydroxypropionate was used as the solvent.

Evaluations were made in the same manner as in Example 1 except that the liquid composition (S-2) was used. The evaluation results are shown in Table 1 together with the film thickness of the coating film.

Example 3

A dispersion prepared by dispersing 300 parts by weight of $ZrO_2$ particles having an average particle diameter of 0.04 μm in 600 parts by weight of methyl ethyl ketone as the inorganic oxide particles (A), a polymer solution containing 100 parts by weight of the copolymer (B-3) obtained in Synthetic Example 3 as the copolymer (B), 50 parts by weight of pentaerythritol triacrylate as the polyfunctional unsaturated compound (C), 30 parts by weight of IRGACURE-651 as the radiation sensitive polymerization initiator (D) and 300 parts by weight of ethylene glycol monoethyl ether as the solvent were mixed together and the resulting mixture was filtered with a Millipore filter having a pore size of 1.0 μm to prepare a liquid radiation sensitive composition (S-3).

Thereafter, the storage stability of the liquid composition (S-3) was evaluated in the same manner as in Example 1.

A patterned thin film was formed and evaluated in the same manner as in Example 1 except that the liquid composition (S-3) was used and shower development was carried out with a 2.38 wt % aqueous solution of tetramethylammonium hydroxide at 25° C. for 1 minute. The evaluation results are shown in Table 1 together with the film thickness of the coating film.

Example 4

A liquid radiation sensitive composition (S-4) was prepared in the same manner as in Example 3 except that a polymer solution containing 100 parts by weight of the copolymer (B-4) obtained in Synthetic Example 4 was used as the copolymer (B) and 100 parts by weight of cyclohexanone was used as the solvent.

The storage stability of the liquid composition (S-4) was evaluated in the same manner as in Example 1.

A patterned thin film was formed and evaluated in the same manner as in Example 3 except that the liquid composition (S-4) was used. The evaluation results are shown in Table 1 together with the film thickness of the coating film.

Example 5

A dispersion prepared by dispersing 200 parts by weight of ZnO particles having an average particle diameter of 0.10 μm in 800 parts by weight of 1-butanol as the inorganic oxide particles (A), a polymer solution containing 100 parts by weight of the copolymer (B-5) obtained in Synthetic Example 5 as the copolymer (B), 70 parts by weight of tris(2-acryloyloxyethyl)phosphate as the polyfunctional unsaturated compound (C), 30 parts by weight of Lucirin TPO as the radiation sensitive polymerization initiator (D) and 1,000 parts by weight of diethylene glycol ethyl methyl ether as the solvent were mixed together and the resulting mixture was filtered with a Millipore filter having a pore size of 1.0 μm to prepare a liquid radiation sensitive composition (S-5).

Thereafter, the storage stability of the liquid composition (S-5) was evaluated in the same manner as in Example 1.

A patterned thin film was formed and evaluated in the same manner as in Example 1 except that the liquid composition (S-5) was used and shower development was carried out with a 0.1 wt % aqueous solution of potassium hydroxide at 25° C. for 1 minute. The evaluation results are shown in Table 1 together with the film thickness of the coating film.

Example 6

A liquid radiation sensitive composition (S-6) was prepared in the same manner as in Example 1 except that a polymer solution containing 100 parts by weight of the copolymer (B-6) obtained in Synthetic Example 6 was used as the copolymer (B).

A patterned thin film was formed and evaluated in the same manner as in Example 1 except that the liquid composition (S-6) was used. The evaluation results are shown in Table 1 together with the film thickness of the coating film.

TABLE 1

| | Examples | | | | | |
|---|---|---|---|---|---|---|
| | 1 | 2 | 3 | 4 | 5 | 6 |
| Storage stability (%) | 3 | 3 | 4 | 4 | 3 | 3 |
| Film thickness (μm) | 4.7 | 6.4 | 10.2 | 12.3 | 2.6 | 2.2 |
| Resolution | ◯ | Δ | ◯ | ◯ | ◯ | Δ |
| Refractive index | 1.74 | 1.73 | 1.69 | 1.70 | 1.65 | 1.64 |
| Transparency (%) | 87 | 84 | 96 | 96 | 91 | 92 |
| Heat resistance (%) | 3 | 2 | 2 | 2 | 3 | 3 |
| Thermal discoloration resistance (%) | 1 | 2 | 1 | 1 | 2 | 3 |
| Solvent resistance (%) | +2 | +3 | +3 | +2 | +3 | +4 |

What is claimed is:

1. A radiation sensitive composition comprising:
   (A) inorganic oxide particles comprising one or more atoms selected from the group consisting of Be, Mg, Ca, Sr, Ba, Sc, Y, La, Ce, Gd, Tb, Dy, Yb, Lu, Ti, Zr, Hf, Nb, Mo, W, Zn, B, Ge, Sn, Pb, Bi and Te;

(B) a copolymer of: at least one unsaturated compound selected from the group consisting of an unsaturated carboxylic acid and an unsaturated carboxylic anhydride; and at least two additional unsaturated compounds, which are different from the at least one unsaturated compound, wherein said copolymer has a weight average molecular weight of 5,000 to 50,000 and a ratio of a number average molecular weight to the weight average molecular weight of 1.0 to 3.0, being in an amount of 100 to 500 parts by weight based on 100 parts by weight of said inorganic oxide particles (A), and selected from the group consisting of: a copolymer of methacrylic acid, dicyclopentanyl methacrylate, and β-methylglycidyl methacrylate; a copolymer of styrene, methacrylic acid, N-phenylmaleimide, and β-methylglycidyl methacrylate; a copolymer of styrene, methacrylic acid, phenyl thiomethacrylate, and 2-hydroxybutyl methacrylate; and a copolymer of styrene, methacrylic acid, and a compound represented by the following formula (2):

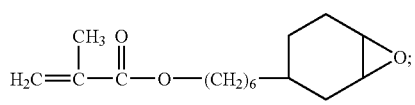

(2)

(C) a polyfunctional unsaturated compound having at least two ethylenically unsaturated groups in the molecule, said polyfunctional unsaturated compound being in an amount of 5 to 500 parts by weight based on 100 parts by weight of said copolymer (B); and (D) a radiation sensitive polymerization initiator, said radiation sensitive polymerization initiator being in an amount of 1 to 200 parts by weight based on 100 parts by weight of said polyfunctional unsaturated compound (C).

2. A process for forming a microlens, wherein said process comprises:
(1) applying the radiation sensitive composition of claim 1 to a substrate to form a coating film;
(2) applying radiation to at least part of the coating film to cure an exposed part;
(3) developing the coating film after exposure to remove an unexposed part; and
(4) heating the coating film after development to form the microlens.

3. A microlens formed by the process of claim 2.

4. A liquid crystal display device, facsimile, electronic copier, solid image pick-up device or optical fiber connector comprising the microlens of claim 3.

5. A microlens comprising the radiation sensitive composition of claim 1.

6. A liquid crystal display device, facsimile, electronic copier, solid image pick-up device or optical fiber connector comprising the microlens of claim 5.

7. The radiation sensitive composition according to claim 1, wherein the one or more atoms contained in the inorganic oxide particles are selected from the group consisting of Be, Mg, Ca, Sr, Ba, Sc, Y, La, Ce, Gd, Tb, Dy, Yb, Lu, Zr, Hf, Nb, Mo, W, Zn, B, Ge, Sn, Pb, Bi and Te.

8. A process for forming a microlens, wherein said process comprises:
(1) applying the radiation sensitive composition of claim 7 to a substrate to form a coating film;
(2) applying radiation to at least part of the coating film to cure an exposed part;
(3) developing the coating film after exposure to remove an unexposed part; and
(4) heating the coating film after development to form the microlens.

9. A microlens formed by the process of claim 8.

10. A liquid crystal display device, facsimile, electronic copier, solid image pick-up device or optical fiber connector comprising the microlens of claim 9.

11. A microlens comprising the radiation sensitive composition of claim 7.

12. A liquid crystal display device, facsimile, electronic copier, solid image pick-up device or optical fiber connector comprising the microlens of claim 11.

* * * * *